United States Patent
Liu et al.

(10) Patent No.: US 10,276,488 B2
(45) Date of Patent: Apr. 30, 2019

(54) METHOD OF FABRICATING FIELD EFFECT TRANSISTOR HAVING NON-ORTHOGONAL GATE ELECTRODE

(71) Applicant: Taiwan Semiconductor Manufacturing Company, Ltd., Hsinchu (TW)

(72) Inventors: Chia-Chu Liu, Shin-Chu (TW); Shiao-Chian Yeh, Kaohsiung (TW); Hong-Jang Wu, Pingtung County (TW); Kuei-Shun Chen, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/720,593

(22) Filed: Sep. 29, 2017

(65) Prior Publication Data

US 2018/0025968 A1 Jan. 25, 2018

Related U.S. Application Data

(62) Division of application No. 13/486,185, filed on Jun. 1, 2012, now abandoned.

(51) Int. Cl.
| | |
|---|---|
| *H01L 23/522* | (2006.01) |
| *H01L 29/66* | (2006.01) |
| *H01L 27/02* | (2006.01) |
| *H01L 21/768* | (2006.01) |
| *H01L 29/423* | (2006.01) |

(52) U.S. Cl.
CPC ...... *H01L 23/522* (2013.01); *H01L 21/76895* (2013.01); *H01L 27/0207* (2013.01); *H01L 29/66545* (2013.01); *H01L 29/4238* (2013.01); *H01L 2924/0002* (2013.01)

(58) Field of Classification Search
CPC ............ H01L 23/522; H01L 21/76895; H01L 29/66545; H01L 29/4238; H01L 27/0207
See application file for complete search history.

(56) References Cited

U.S. PATENT DOCUMENTS

| | | |
|---|---|---|
| 4,844,115 A | 11/1989 | Michel et al. |
| 5,148,246 A | 9/1992 | Taiji et al. |
| (Continued) | | |

OTHER PUBLICATIONS

ASIC Standard Cell Library Design by Graham Petley; "VLSI and ASIC Technology Standard Cell Library Design;" TSMC-1006—pp. 1-17; Full Library Release . . . Nov. 2,1, 2004, http://web.archive.org/web/20041130185146/http://www.vlsitechnology.org/ [Dec. 19, 2013 6:01:57 PM].

(Continued)

*Primary Examiner* — Lex H Malsawma
*Assistant Examiner* — Gardner W. S. Swan
(74) *Attorney, Agent, or Firm* — Haynes and Boone, LLP

(57) ABSTRACT

The present disclosure provides a device includes a first gate structure segment and a collinear second gate structure segment, as well as a third gate structure segment and a collinear fourth gate structure segment. An interconnection extends from the first gate structure segment to the fourth gate structure segment. The interconnection is disposed above the first gate structure segment and the fourth gate structure segment. The interconnection may be formed on or co-planar with a contact layer of the semiconductor device.

20 Claims, 13 Drawing Sheets

(56) References Cited

U.S. PATENT DOCUMENTS

| | | |
|---|---|---|
| 5,385,865 A | 1/1995 | Nieder et al. |
| 5,619,420 A | 4/1997 | Breid |
| 5,620,916 A | 4/1997 | Eden et al. |
| 5,808,330 A | 9/1998 | Rostoker et al. |
| 5,923,955 A | 7/1999 | Wong |
| 6,051,870 A | 4/2000 | Ngo et al. |
| 6,340,608 B1 | 1/2002 | Chooi et al. |
| 6,617,696 B1 | 9/2003 | Bendal et al. |
| 6,635,935 B2 | 10/2003 | Makino |
| 6,737,347 B1 | 5/2004 | Houston et al. |
| 6,753,611 B1 | 6/2004 | Maeno et al. |
| 7,279,727 B2 | 10/2007 | Ikoma et al. |
| 7,382,049 B2 | 6/2008 | Ho et al. |
| 7,468,316 B2 | 12/2008 | Lee et al. |
| 7,476,564 B2 | 1/2009 | Chen et al. |
| 7,495,330 B2 | 2/2009 | Ichikawa |
| 7,503,026 B2 | 3/2009 | Ichiryu et al. |
| 7,538,368 B2 | 5/2009 | Yano |
| 7,939,384 B2 | 5/2011 | Chuang et al. |
| 7,956,421 B2 | 6/2011 | Becker et al. |
| 8,338,967 B2 | 12/2012 | Hochsenbach et al. |
| 8,558,379 B2 | 10/2013 | Kwon |
| 8,631,374 B2 | 1/2014 | Sherlekar et al. |
| 8,643,196 B2 | 2/2014 | Yu et al. |
| 8,669,137 B2 | 3/2014 | Nah et al. |
| 8,697,490 B2 | 4/2014 | Pendse et al. |
| 8,877,556 B2 | 11/2014 | Nah et al. |
| 9,419,090 B2 * | 8/2016 | Yu .................... H01L 21/82387 |
| 2003/0189261 A1 | 10/2003 | Tong et al. |
| 2005/0205894 A1 | 9/2005 | Sumikawa et al. |
| 2006/0012055 A1 | 1/2006 | Foong et al. |
| 2006/0223313 A1 | 10/2006 | Yoon et al. |
| 2007/0001277 A1 | 1/2007 | Ichikawa |
| 2007/0114671 A1 | 5/2007 | Brown et al. |
| 2007/0284671 A1 * | 12/2007 | Tsutsumi .......... H01L 21/28097 257/369 |
| 2009/0146303 A1 | 6/2009 | Kwon |
| 2010/0006951 A1 * | 1/2010 | Becker ................ H01L 27/0207 257/390 |
| 2010/0117157 A1 * | 5/2010 | Miyake ............. H01L 21/28052 257/368 |
| 2010/0159685 A1 * | 6/2010 | Chuang ............... H01L 27/0207 438/587 |
| 2011/0037175 A1 * | 2/2011 | Bangsaruntip .... H01L 21/31144 257/773 |
| 2012/0025317 A1 * | 2/2012 | Zhong ............... H01L 21/76897 257/368 |
| 2012/0028434 A1 * | 2/2012 | Lee .......................... G03F 7/40 438/400 |
| 2013/0026614 A1 | 1/2013 | Yu et al. |

OTHER PUBLICATIONS

International Tungsten Industry Association, Newsletter, 2004.

Lars Liebmann, Greg Northrop, James Culp, Leon Sigal, Arnold Barish and Carlos Fonseca, "Layout Optimization At the Pinnacle of Optical Lithography," TSMC-1005—pp. 1-14, Design and Process Integration for Microelectronic Manufacturing II, Alexander Starikov Editor, Proceedings of SPIE vol. 5042 (2003), www:lliebman@us.ibm.com.

* cited by examiner ed States Patent

US 10,276,488 B2

METHOD OF FABRICATING FIELD EFFECT TRANSISTOR HAVING NON-ORTHOGONAL GATE ELECTRODE

This application is a divisional of application Ser. No. 13/486,185, filed Jun. 1, 2012, which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

One challenge with the decreasing geometry of semiconductor ICs is the formation of interconnections between elements of a semiconductor device. These interconnections can take up valuable area of the layout of a semiconductor device. Thus, what is desired is a device and method that may reduce the layout area and provide flexible patterning of interconnections between elements of a semiconductor device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
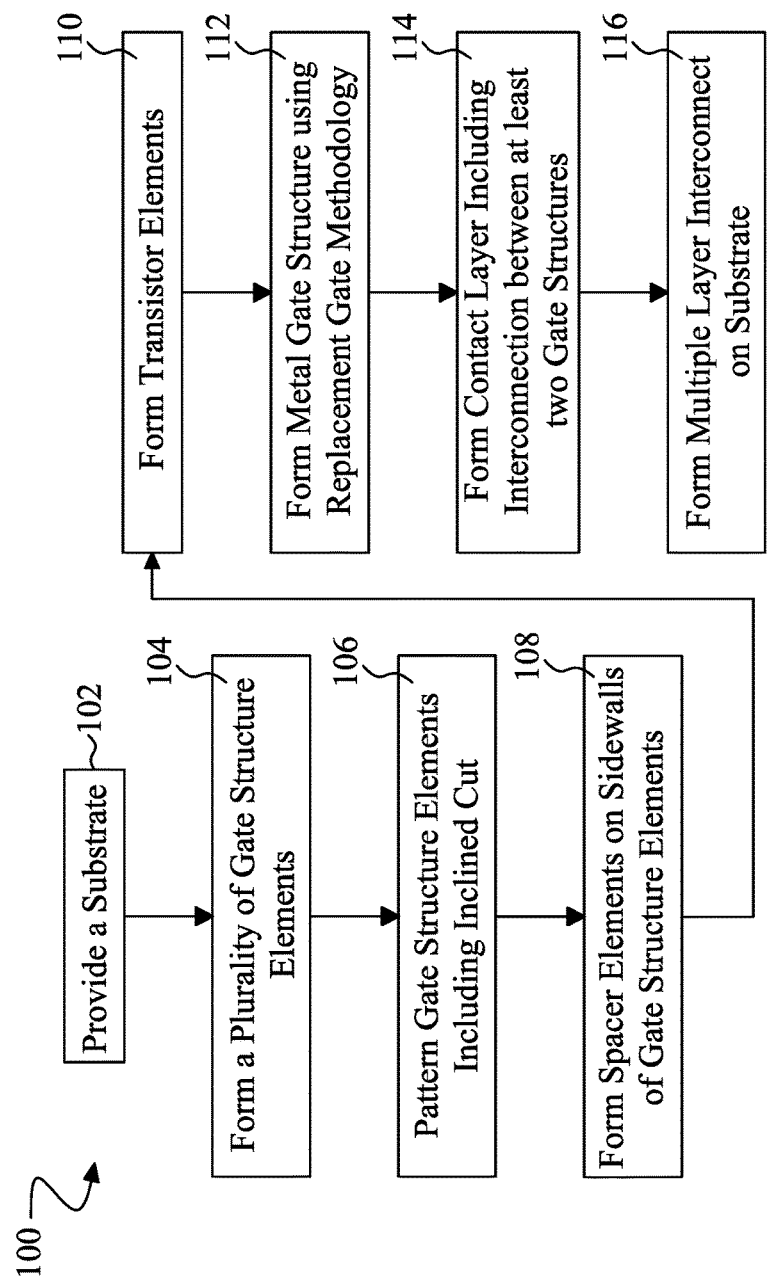
FIG. 1 is a flow chart of an embodiment of a method of fabricating a semiconductor device according to one or more aspects of the present disclosure.

Illustrated in FIG. 1 is a method 100 of fabricating a semiconductor device. The method 100 may be useful for fabricating a semiconductor device having at least one non-orthogonal element. In an embodiment, the non-orthogonal element is an interconnect, for example, connecting gate structures. In an embodiment, the method 100 including a non-orthogonal cut of a plurality of gate structure elements (e.g., lines or strips). The term non-orthogonal as used herein may be used to describe any element or method that includes an inclined or slanted feature (e.g., not at a substantially right angle or perpendicular to a referenced feature). The non-orthogonal cut may provide for a non-orthogonal end of a gate structure. The non-orthogonal cut across adjacent gate structure elements (strips) may provide a configuration of the elements such that the ends are not collinear with respect to a line drawn perpendicular to the length of the gate structures. FIGS. 2-14 are cross-sectional and top-views of a semiconductor device 200 fabricated according to embodiments of the method 100 of FIG. 1.

It is understood that parts of the method 100 and/or device 200 are provided by complementary metal-oxide-semiconductor (CMOS) technology process flow, and thus some processes are only briefly described herein. Further, the semiconductor device 200 may include various other devices and features, such as additional transistors, bipolar junction transistors, resistors, capacitors, diodes, fuses, etc., but is simplified for a better understanding of the inventive concepts of the present disclosure. The semiconductor device 200 includes a plurality of semiconductor devices (e.g., transistors), which may be interconnected.

The method 100 begins at block 102 where a substrate is provided. The semiconductor substrate may typically be a silicon substrate. The substrate may include various doping configurations depending on design requirements as is known in the art. The substrate may also include other elementary semiconductors such as germanium and diamond. Alternatively, the substrate may include a compound semiconductor and/or an alloy semiconductor. Further, the substrate may optionally include an epitaxial layer (epi layer), may be strained for performance enhancement, may include a silicon-on-insulator (SOI) structure, and/or have other suitable enhancement features. The substrate may include active regions on which MOS devices can be formed. The active regions may be doped with suitable n-type or p-type dopants (impurities) to form well regions. The boundaries of the active regions may be defined by isolation structures such as shallow trench isolation (STI) features. In other embodiments, other types of isolation structures are possible. The substrate may include isolation features such as a shallow trench isolation (STI), field oxide, a local-oxidation of silicon (LOCOS) feature, and/or other suitable isolation features. The isolation structure may be formed of silicon oxide, silicon nitride, silicon oxynitride, fluoride-doped silicate glass (FSG), a low-k dielectric, combinations thereof, and/or other suitable material.

Figure 3:
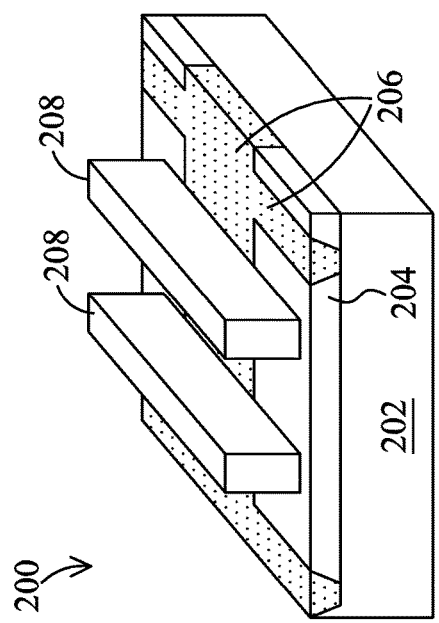
FIGS. 2-12 illustrate an embodiment of a semiconductor device according to one or more steps of the method of FIG. 1.
Figure 2:
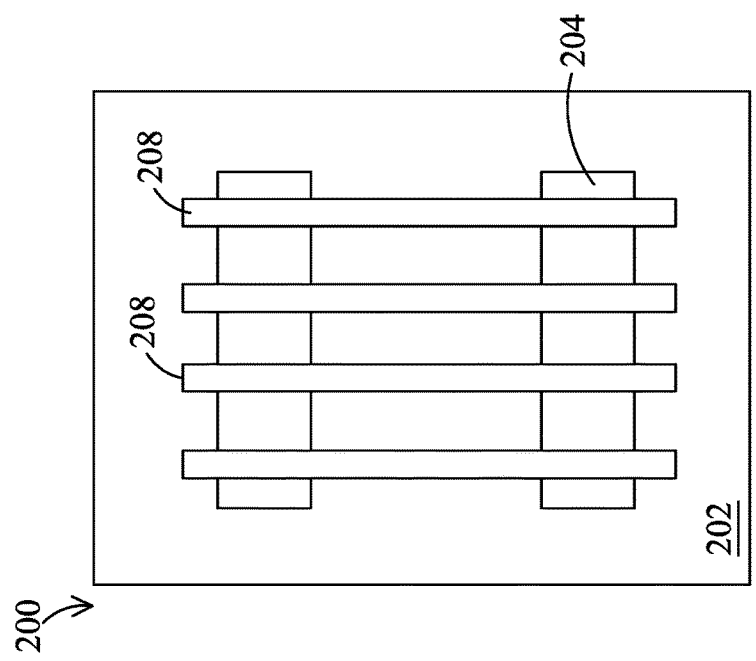

Referring to the examples of FIGS. 2 and 3, a top view of a semiconductor device 200 having a substrate 202 is provided in FIG. 2. A cross-sectional view of a portion of the semiconductor device 200 is provided in FIG. 3. The substrate 202 includes a plurality of active regions 204. Isolation features 206 interpose the active regions 204. As illustrated, the isolation features 206 include STI features.

The method 100 then proceeds to block 104 where a plurality of gate structure elements is formed on the substrate. In an embodiment, the gate structure elements may be formed as "strips" extending substantially parallel to one another. The gate structure elements may include a gate dielectric and/or a gate electrode layer. In an embodiment, one or more of the layers of the gate structure elements are sacrificial (e.g., dummy) layers.

In an embodiment, the gate structure element includes a gate dielectric layer. In an embodiment, the gate dielectric layer includes a dielectric material such as silicon oxide, for example, formed by thermal oxidation or suitable deposition methods. In an embodiment, the gate dielectric layer includes a high-k dielectric layer, for example, formed by atomic layer deposition (ALD) or other suitable technique. The high-k dielectric layer may include hafnium oxide ($HfO_2$). Alternatively, the high-k dielectric layer may include other high-k dielectrics, such as $TiO_2$, $HfZrO$, $Ta_2O_3$, $HfSiO_4$, $ZrO_2$, $ZrSiO_2$, combinations thereof, and/or other suitable material. Further, the gate dielectric layer may include a multiple layer configuration.

The gate structure element may further include a gate electrode. The gate electrode may be sacrificial, for example, such as formed in a replacement gate process. In an embodiment, the gate electrode layer includes polysilicon. However, other embodiments are possible. The polysilicon layer may be formed by suitable deposition processes such as, for example, low-pressure chemical vapor deposition (LPCVD) and plasma-enhanced CVD (PECVD).

Referring to the example of FIGS. 2 and 3, a plurality of gate structure elements 208 are disposed on the substrate 202. As illustrated, the gate structure elements 208 are patterned such that they form strips. The gate structure elements 208 may be formed by depositing one or more layers of the gate structure elements. The layers may be patterned using suitable photolithography processes such as, for example, forming a photoresist layer, exposing the photoresist layer to a pattern, baking and developing the photoresist to form masking elements. The masking elements may then be used to etch a pattern (e.g., strips) into the layers of the gate structure element (e.g., the polysilicon). The plurality of gate structure elements 208 are substantially parallel to each other and extend from one active region 204 to another. While the illustrated embodiment shows the gate structure elements 208 being of substantially equal width and pitch, other embodiments are possible.

The method 100 then proceeds to block 106 where the gate structure elements are patterned again. The patterning includes an inclined or non-orthogonal cut of at least one gate structure such that it is sectioned. For example, a gate structure element is cut such that it is provided in two sections, with an space interposing the sections. The two sections of the gate structure may be collinear. In an embodiment, a plane extending from the face of the end of a segment of a gate structure element is not substantially perpendicular to or orthogonal to a plane extending along a center line of the length of the gate structure element (i.e., it is at a slant or incline with respect to the length of the gate structure element or a plane perpendicular to the length of the gate structure). In other words, the face of the end of the gate structure element may be non-orthogonal to one or more of the sidewalls of the gate structure.

In an embodiment, two (e.g., adjacent) gate structure elements are cut and the cut extends across the gate structures in a non-orthogonal manner. For example, the cut may extend across the gate structures at an angle other than 90 degrees, for example approximately 45 degrees from a centerline drawn along the length of the gate structure element(s). In an embodiment, adjacent gate structures are cut such that an imaginary line drawn from the ends of the gate structure elements is non-orthogonal (or inclined) with respect to a line parallel to a centerline drawn along the length of the gate structure(s).

As discussed above, one or more gate structure elements (e.g., strips) may be cut or etched such that a portion of the gate structure element is removed from the substrate. In an embodiment, a photoresist layer is deposited on the gate structure element (e.g., strip); the photoresist layer then is exposed to an inclined pattern formed on a suitable photomask, developed thereby forming a masking element on the gate structure element(s). The masking elements may be used to protect regions of the gate elements while portions are etched. Other methods of patterning such as e-beam lithography are possible. The patterning of block 106 may be separate and distinct from the patterning of block 104, where the gate structure elements (e.g., strips) are formed.

Figure 4:
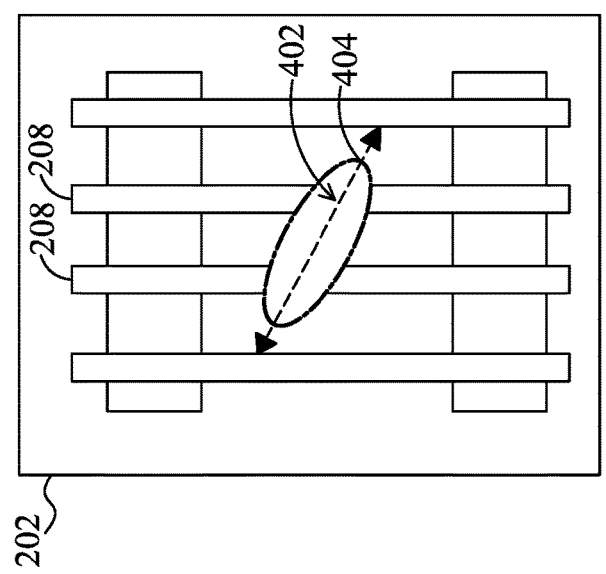
Figure 5:
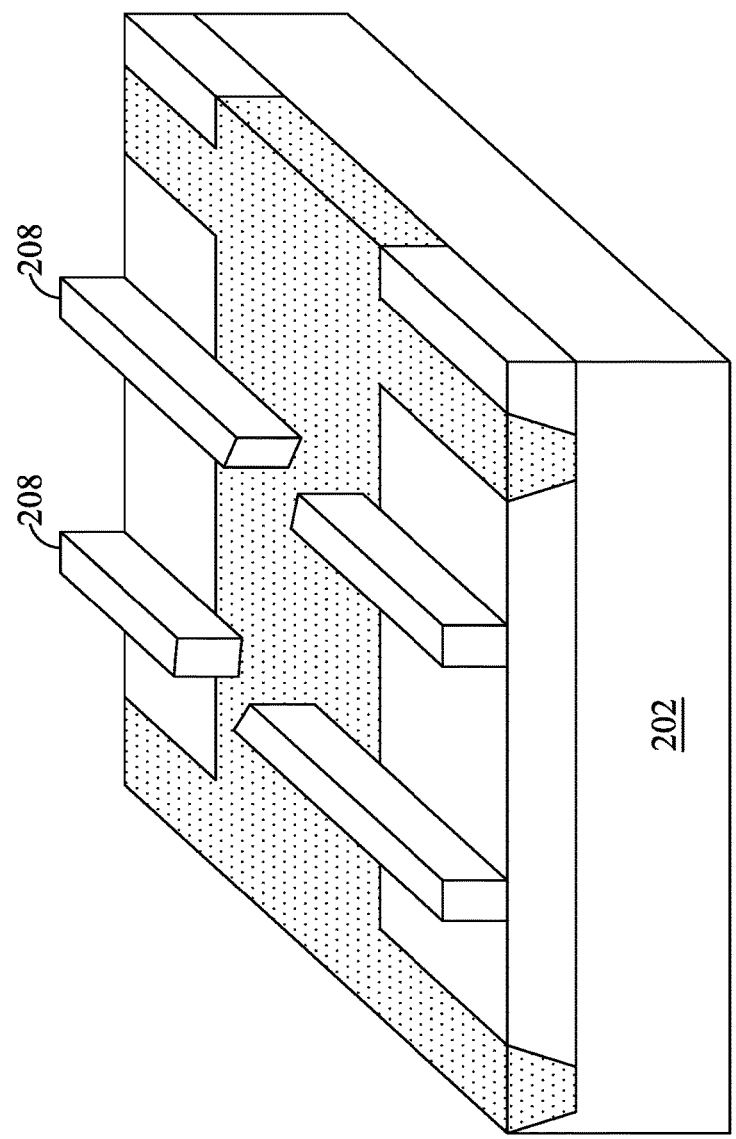

Referring to the example of FIGS. 4 and 5, a first and second gate structure element 208 are cut non-orthogonally or at an incline. The region removed from the gate structures is denoted 402. The region 402 may be defined by photolithography methods. The cut is a non-orthogonal or inclined cut as illustrated by line 404.

Figure 6:
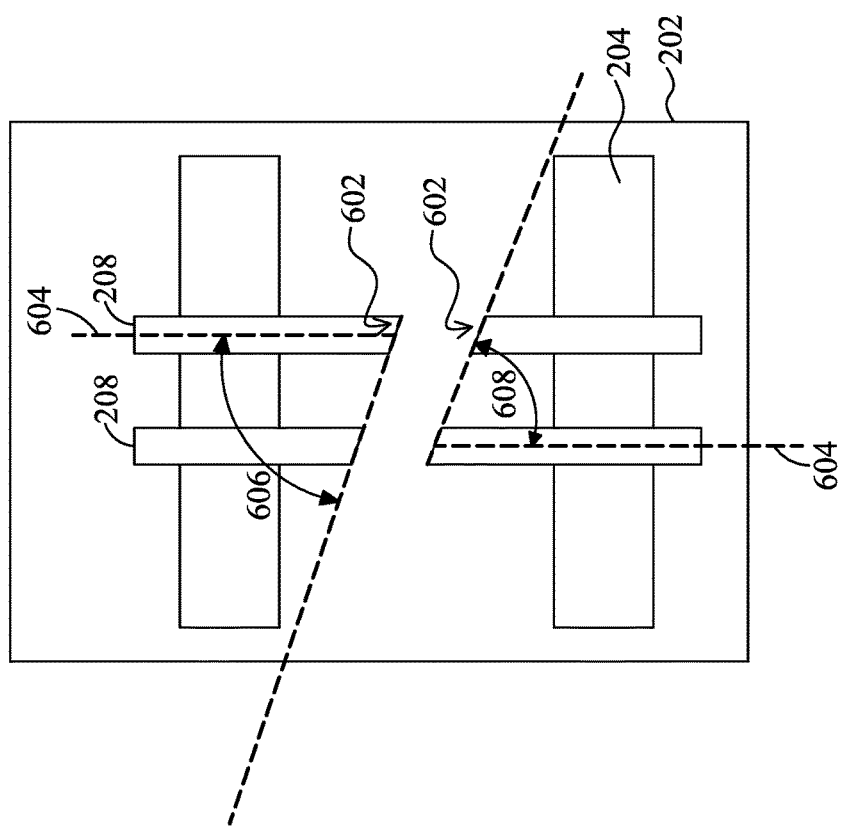
Figure 7:
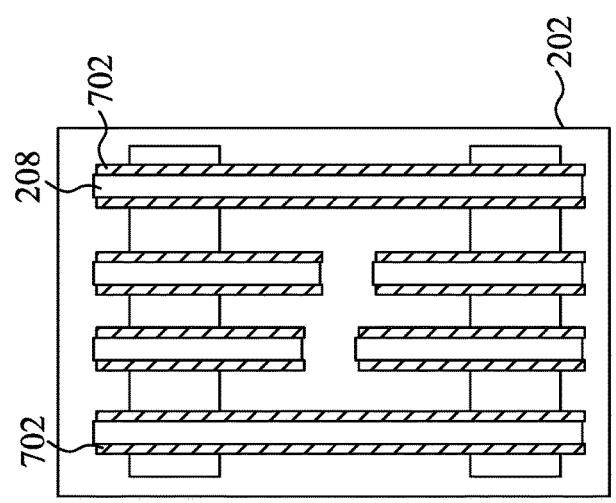
Figure 8:
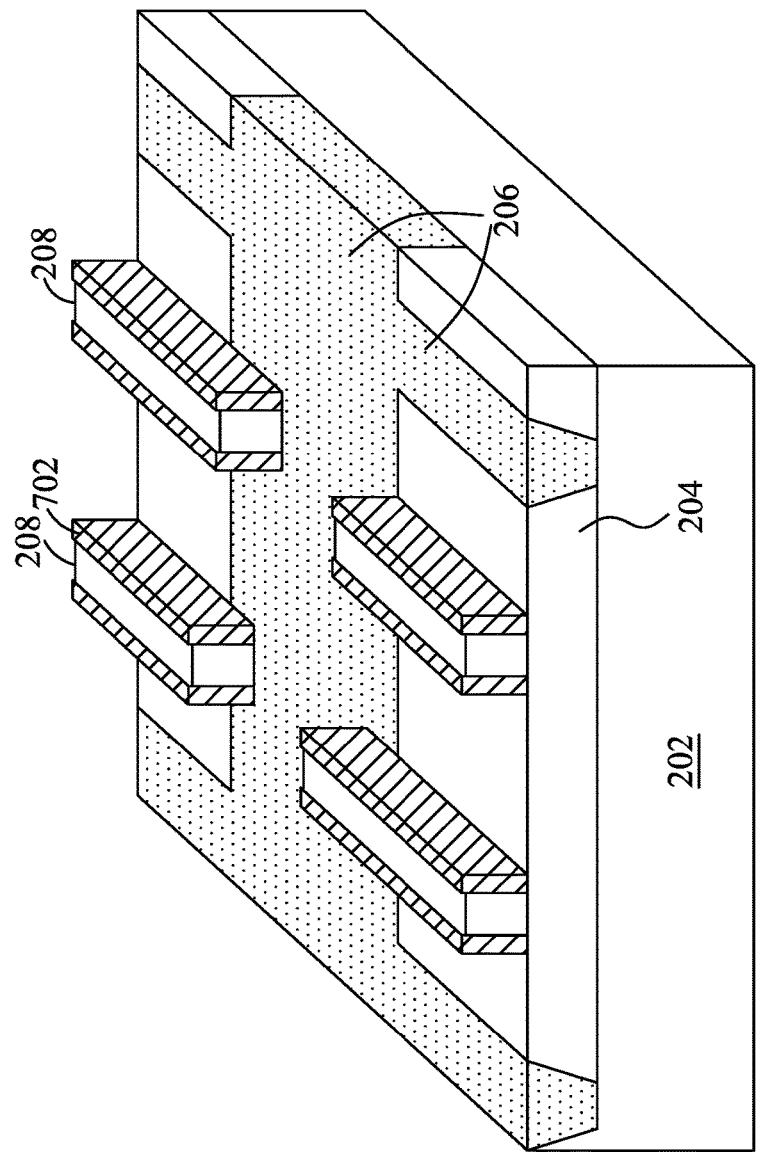

FIG. 6 illustrates further details of an embodiment of cut gate structure elements 208. The end of the gate structure 208 is illustrated as 602. Surface 602 is inclined or non-orthogonally, for example, compared to a centerline extending along the gate structure element, denoted as line 604. The center line 604 may extend in the direction substantially parallel the gate structure elements. In other embodiments, a single end 602 (e.g., lateral face) of a cut gate structure may be substantially perpendicular to the respective center line 604.

FIGS. 4, 5, and 6 also illustrate a non-orthogonal cut across a plurality of gate structure elements. The non-orthogonal cut provides adjacent gate structure elements 208 disposed non-orthogonally to one another, or in other words, at an angle 606 with respect to the center line 604. The angle 606 may be less than approximately 90 degrees. In an embodiment, the angle 606 is approximately 45 degrees. In another embodiment, the angle 606 is between approximately 75 degrees and approximately 20 degrees. The non-orthogonal cut provides a second set of adjacent gate structure elements 208 disposed non-orthogonally to one another, or in other words, at an angle 608 with respect to the center line 604. The angle 608 may be less than approximately 90 degrees. In an embodiment, the angle 608 is approximately 45 degrees. In another embodiment, the angle 608 is between approximately 75 degrees and approximately 20 degrees. While the non-orthogonal cut is illustrated as segmenting two adjacent gate structure elements, any number of gate structure elements may be segment and thus, be disposed non-orthogonally form one another. The gate structure elements 208 may be sectioned using a single photolithography and/or etching process, where those processes provide a non-orthogonal sectioning of the gate structure elements.

The method 100 then proceeds to block 108 where spacer elements are formed on sidewalls of the gate structure elements. In embodiments, spacer elements may be formed abutting the sidewalls of the gate structures prior to or after the formation of an associated source/drain regions (or portions thereof). The spacer elements may be formed by depositing a dielectric material followed by an isotropic etching process, however other embodiments are possible. In an embodiment, the spacer elements include silicon oxide, silicon nitride, and/or other suitable dielectrics. The spacer elements may include a plurality of layers. For example, in an embodiment, the spacer elements include seal liners, main spacer wall layers, spacers defining low-dose drain (LDD) regions, and/or other suitable spacers. Referring to the example of FIGS. 7 and 8, spacer elements 702 are formed abutting the sidewalls of the gate structures 208. The spacer elements 702 may also be referred to as main spacer walls.

The method 100 then proceeds to block 110 where a transistor element is formed. In an embodiment, source/drain regions are formed in the active regions of the substrate associated with a gate structure element. The source/drain regions may include the introduction of suitable dopant types: n-type or p-type dopants. The source/drain regions may include halo or low-dose drain (LDD) implantation, source/drain implantation, source/drain activation (e.g., anneal), and/or other suitable processes. In other embodiments, the source/drain regions may include raised source/drain regions, strained regions, epitaxially-grown regions, and/or other suitable techniques. In an embodiment, the method 100 includes the silicidation of doped source/drain regions. The silicide materials may include nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The silicide features can be formed by a process that includes depositing a metal layer, annealing the metal layer such that the metal layer is able to react with silicon to form silicide, and then removing the non-reacted metal layer.

The method 100 then proceeds to block 112 where a metal gate structure is formed using a replacement gate methodology. In alternative embodiments, the method 100 may include a gate-first process or other technology such that the non-orthogonal cut described above with reference to block 106 is provided on a metal gate structure or a polysilicon gate structure that remains on the substrate in the final device.

In an embodiment, the method 100 includes a replacement gate process. For example, a contact etch stop layer (CESL) and/or intermediate dielectric layer (ILD) are formed on and/or interposing the plurality of gate structures. Examples of materials that may be used to form CESL include silicon nitride, silicon oxide, silicon oxynitride, and/or other materials known in the art. The CESL may be formed by PECVD process and/or other suitable deposition or oxidation processes. The dielectric layer may include materials such as, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric layer may be deposited by a PECVD process or other suitable deposition technique. A planarization process is then performed to expose a top surface of a gate structure. The planarization process may include a chemical mechanical planarization (CMP). A sacrificial layer of the gate structures described above, for example, polysilicon, may then be removed to form a trench in which a metal gate structure may be formed. A metal gate is then formed in the trench(es). The metal gate may include gate dielectric layer(s), work function layer(s), capping layer(s), fill layer(s), and/or other suitable layers. A work function metal layer included in the metal gate may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, and/or other suitable process. A dielectric layer of the metal gate structure may include a high-k dielectric layer such as hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, or other suitable material. The dielectric layer may be formed by ALD and/or other suitable methods.

A fill layer of the metal gate structure may include Al, W, or Cu and/or other suitable materials. The fill metal may be formed by CVD, PVD, plating, and/or other suitable processes. The fill metal may be deposited over a work function metal layer(s), and thereby filling in the remaining portion of the trenches or openings.

Figure 9:
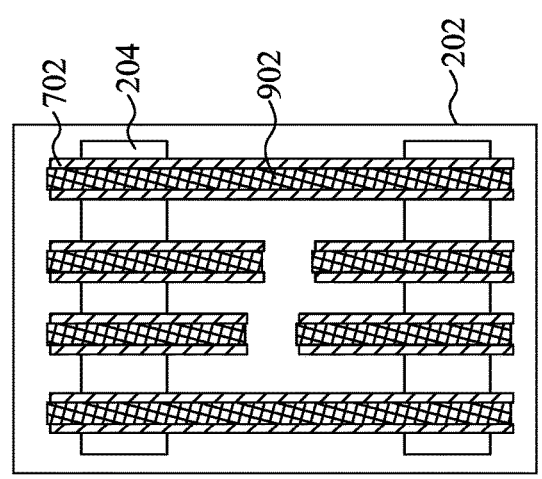
Figure 10:
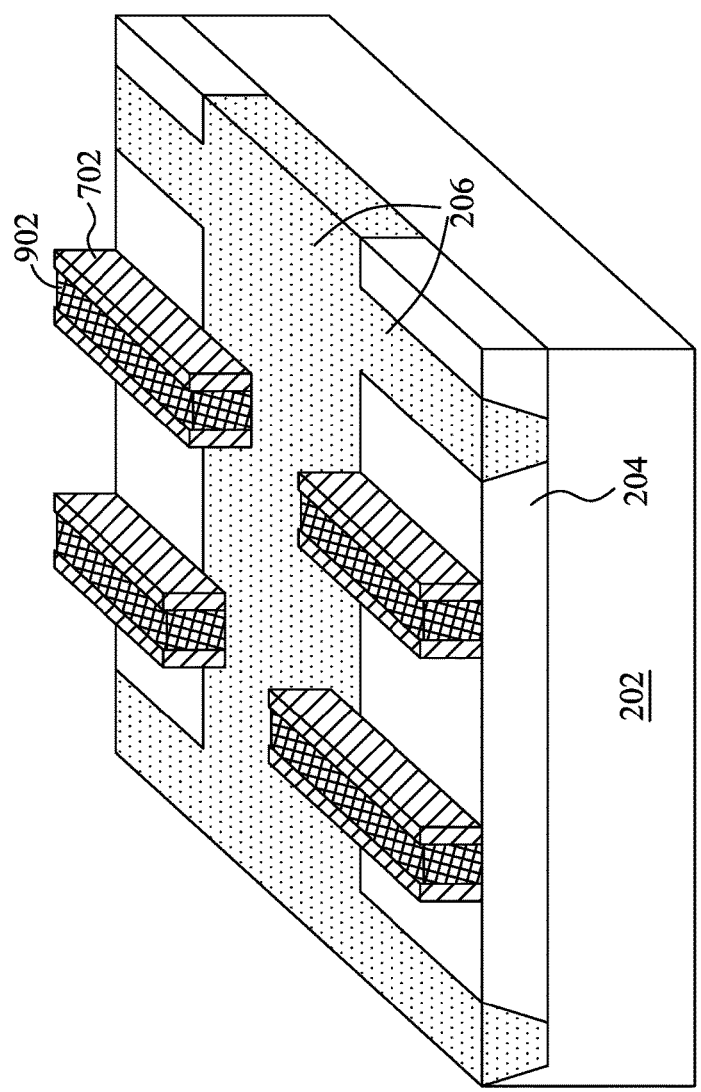

Referring to the example of FIGS. 9 and 10, the gate structure 208 has been replaced (in whole or in part) by a metal gate structure 902. The metal gate structure 902 includes the same dimensions as the gate structure 208 (e.g., having been formed in a trench created by its removal). Thus, the metal gate structure 902 includes the non-orthogonal features discussed above with reference to FIG. 6. In other words, the metal gate structures 902 have non-orthogonal or inclined segments.

The method 100 then proceeds to block 114 where a contact layer including a plurality of contact elements is formed on the substrate. The contact layer includes an interconnect structure connecting two gate structures (e.g., gate structure segments having been provided by the orthogonal or inclined cut described above with reference to block 106).

In an embodiment, an inter-layer dielectric (ILD) layer is first formed on the substrate on and/or above the metal gate structure. The ILD layer may include dielectric materials such as, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer may be deposited by a PECVD process or other suitable deposition technique. The ILD layer may be the same as or differently composed as the dielectric layer described above with reference to block 112.

Contact elements are then formed to one or more of the features on the substrate. The contact element may also provide interconnection to one or more of the interconnect layers of a multilayer interconnect (MLI), described below, and a transistor feature. The contact elements may include tungsten or other suitable conductive element. The contact elements may be formed by etching trenches or openings in the ILD layer and filling the trenches with a conductive material to form vias or plugs. The vias or plugs may contact features such as source/drain regions and/or the gate structure (e.g., metal gate structure). The contact elements may be provided to a silicided region of the source/drain or other feature. Such contact elements may be referred to as contact plugs, or simply plugs.

In an embodiment, the contact layer of the device of the method 100 includes contact elements and an interconnection structure between segments of the non-orthogonally cut gate structure elements. Thus, the interconnection between the segments of the gate structure elements is provided on a contact layer (or level) of the semiconductor device. In other words, the interconnection is co-planar with a contact, for example, a contact to a gate structure element. The interconnection in the contact layer may be non-orthogonal or not a straight, linear connection. In an embodiment, the interconnection may be a slanted or traverse interconnection connecting adjacent gate structures. In an embodiment, the interconnection may connect adjacent gate structures using a plurality of line segments including those parallel and traverse to the gate structure lengths. The interconnection may be formed on portions of the gate structures, such as a top surface. For example, the interconnection may be formed on a top surface of the gate electrode, on a top surface of the spacer elements, on a top surface of a metal layer in the gate structure, and/or other suitable layers as illustrated in the embodiments of FIGS. 11-14, described below.

Figure 11:
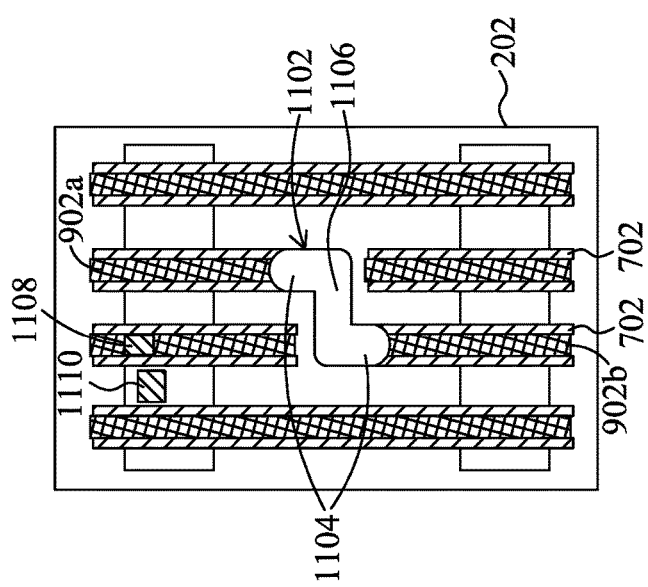
Figure 12:
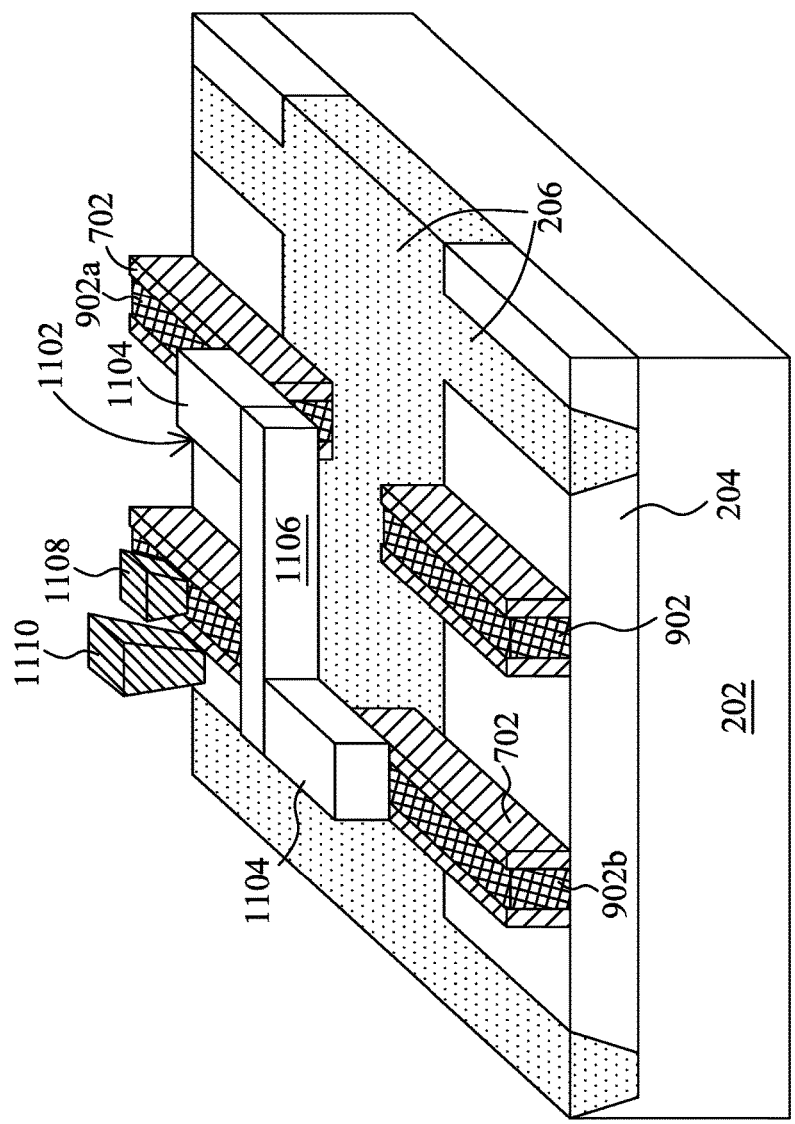

Referring to the example of FIGS. 11 and 12, a contact-level interconnection 1102 is illustrated connecting gate structures 902a and 902b. The contact-level interconnection 1102 provides physical and electrical connection between gate structures 902a and 902b. The contact-level interconnection 1102 includes two segments 1104 extending on and parallel with the length of the gate structure elements 902 and further includes a lateral segment 1106 extending substantially transverse or perpendicular to the length of the gate structure elements 902.

The contact-level interconnection 1102 is co-planar with a contact element (or plug) 1108 provided to the gate structure element 902. The contact-level interconnection 1102 is co-planar with a contact element (or plug) 1110 provided to the substrate 202 (e.g., a source/drain region).

Figure 13:
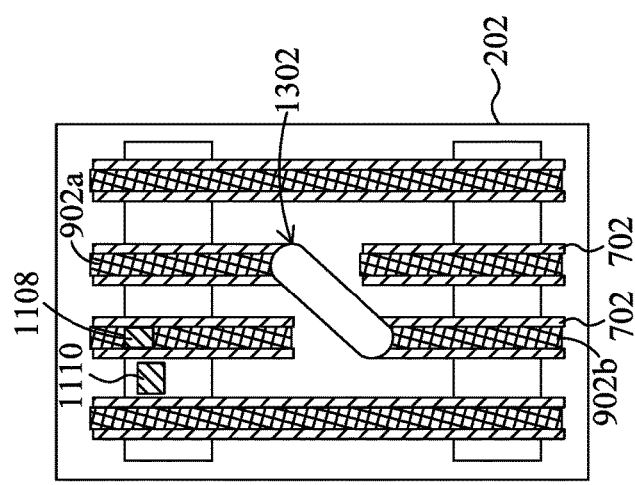
FIGS. 13-14 illustrate another embodiment of a semiconductor device according to one or more steps of the method of FIG. 1.
Figure 14:
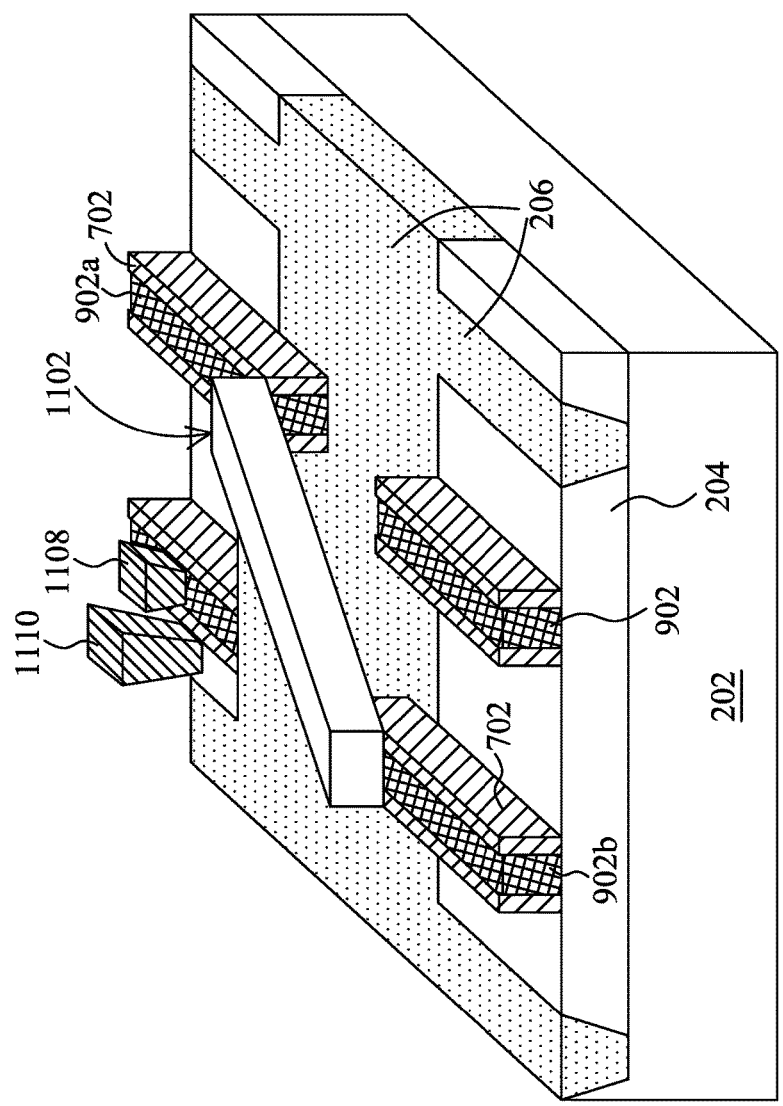

Referring to the example of FIGS. 13 and 14, a contact-level interconnection 1302 is illustrated connecting gate structures 902a and 902b. The contact-level interconnection 1302 provides physical and electrical connection between gate structures 902a and 902b. The contact-level interconnection 1302 extends substantially transverse to the length of the gate structure elements 902.

The contact-level interconnection 1302 is co-planar with the contact element (or plug) 1108 provided to the gate structure element 902. The contact-level interconnection 1302 is co-planar with a contact element (or plug) 1110 provided to the substrate 202 (e.g., a source/drain region).

The method 100 then proceeds to block 116 where a multiple layer interconnect (MLI) structure is formed on the substrate. The MLI structure includes a plurality of conductive (metal) lines stacked laterally with vias interposing and connecting the layers. The conductive lines are typically referred to as metal 1, metal 2, etc. The MLI structure may include a plurality of ILD layers interposing the conductive layers.

In summary, the methods and devices disclosed herein provide for a semiconductor device and method of fabricating thereof, that provides for a non-orthogonal element. In doing so, embodiments of the present disclosure offer several advantages over prior art devices. Advantages of aspects of the present disclosure include horizontal interconnection between adjacent gate structures in a manner that is efficient and effective with respect to layout space. For example, horizontal patterning of the gate structure itself (e.g., connecting 908a and 908b at the gate-level) may be difficult to achieve in shrinking geometries. For example, the spacer process may be unable to sustain a horizontal interconnection. Thus, the disclosure provides a device and method having a layout that provides a horizontal connection without or with minimal impact to the spacer process. Another example of an advantage of some embodiments is that as the distance between active regions (e.g., distance between 204) of a substrate decrease with decreasing technology nodes one slanted cut (e.g., etch process/mask) can be performed as opposed to etching each gate structure separately. See FIG. 4 allowing for a single but of a plurality of gate structures 208. This single cut may save process time and/or device area.

It is understood that different embodiments disclosed herein offer different disclosure, and that they may make various changes, substitutions and alterations herein without departing from the spirit and scope of the present disclosure. As but one example, though the present disclosure and the embodiment of method 100 include a replacement gate metal gate process, the present disclosure may be applicable to other methods and device types including those with a polysilicon gate structure.

Thus, provided in an embodiment is a semiconductor device. The semiconductor device includes a first gate structure segment and a collinear second gate structure segment, as well as a third gate structure segment and a collinear fourth gate structure segment. An interconnection structure extends from the first gate structure segment to the fourth gate structure segment. The interconnection structure is disposed above the first gate structure segment and the fourth gate structure segment.

In a further embodiment, the interconnection structure includes a first portion disposed on the first gate structure segment and a second portion disposed on the fourth gate structure segment. The first and second portions may be substantially parallel. A third portion of the interconnect structure connects the first and second portions and is substantially perpendicular to the first and second portions. A contact plug may be co-planar with the interconnection structure, the interconnection structure, for example, being formed on the same "layer" of the semiconductor device as the contact elements (e.g., underlying metal 1). Like a contact plug, the interconnection structure may include tungsten, or other conductive material.

The semiconductor device, in embodiments, includes spacer elements formed on sidewalls of the gate structure segments; the interconnection structure may be disposed on a top surface of the spacer elements.

In embodiments of the semiconductor device, the first gate structure segment is non-orthogonal with respect to a third gate structure segment such that an imaginary line drawn from a first end of the first gate structure segment to a first end of the third gate structure segment is non-orthogonal with respect to a sidewall of the first gate structure segment. See FIG. 6.

In another embodiment described herein, a semiconductor device includes a first gate structure, a second adjacent gate structure, and a third gate structure disposed on a substrate. An interconnection structure is between the second gate structure and the third gate structure. A third gate structure may be aligned with and spaced a first distance from the first gate structure, and the third gate structure may be parallel to the second gate structure. The first gate structure may be non-orthogonally disposed with respect to the second gate structure. For example, the first gate structure may be non-orthogonally with respect to the second gate structure such that an imaginary line drawn from a first end of the first gate structure to a first end of the second gate structure is non-orthogonal with respect to a sidewall of at least one of the first and second gate structures. The respective first ends of the gate structures may be disposed on an isolation region (e.g., STI). In an embodiment, an end of the first gate structure is non-orthogonal with respect to a sidewall of the first gate structure.

As discussed above, in a further embodiment of the device, the interconnection may not be co-planar with a plane extending through the second gate structure and the third gate structure (e.g., a lateral plane). The interconnection structure may be co-planar with a contact connected to the first gate structure. In embodiments, a fourth gate structure collinear with the second gate structure and spaced a second distance from the second gate structure is provided in the device. The first distance and the second distance may be substantially equal, although the associated space between the third gate structure and the first gate structure and the associated space between the fourth gate structure and the second gate structure may be offset from one another in a direction parallel to the length of the first gate structure.

In another embodiment, a method of semiconductor fabrication includes forming a first gate structure and a second gate structure on a semiconductor substrate and cutting the first gate structure and the second gate structure concurrently. (The cutting may be defined by a photolithography process and etching of the gate structures.) The first gate structure is cut to form a first gate segment and a second gate segment, and the second gate structure is cut to form a third segment and a fourth segment. The cutting includes performing an inclined cut (e.g., 45 degrees with respect to a length of the first gate structure) of the first gate structure and the second gate structure.

In a further embodiment, the gate structure may be formed by forming a dielectric layer; forming a polysilicon layer on the dielectric layer; and patterning the dielectric layer and the polysilicon layer to provide the first gate structure and the second gate structure.

In embodiments, the method continues to include forming an interconnect structure connecting a segment of the first gate structure and a segment of the second gate structure by forming a conductive material on the second segment and on the third segment. The segments of the first and second gate structure are formed by the cutting process. The interconnect structure may be formed concurrently with a contact plug coupled to the first gate structure. The interconnect structure may be formed on the segments of the first and second gate structures, for example, on a top surface of the gate electrode, on a top surface of the spacer elements, on a top surface of a metal layer in the gate structure, and/or other suitable layers.

What is claimed is:

1. A method of semiconductor fabrication, comprising:
   forming a first gate structure and a second gate structure on a semiconductor substrate, wherein the second gate structure is parallel the first gate structure and spaced a first distance from the first gate structure in a first direction;
   cutting the first gate structure and the second gate structure concurrently, wherein the first gate structure is cut to form a first and second segment, the first segment spaced a distance from the second segment in a second direction, the second direction perpendicular the first direction, and the second gate structure is cut to form a third and fourth segment, wherein the cutting includes performing an inclined cut of the first gate structure and the second gate structure; and
   forming an interconnect structure connecting the second segment of the first gate structure and the third segment of the second gate structure, wherein the forming the interconnect structure includes forming a conductive material having a planar bottom surface extending from a first interface with the second segment of the first gate structure to a second interface with the third segment of the second gate structure.

2. The method of claim 1, wherein the forming the first gate structure and the second gate structure includes:
   forming a dielectric layer;
   forming a polysilicon layer on the dielectric layer; and
   patterning the dielectric layer and the polysilicon layer to provide the first gate structure and the second gate structure.

3. The method of claim 1, wherein the inclined cut is approximately 45 degrees with respect to a length of first gate structure.

4. The method of claim 3, wherein the forming the interconnect structure includes forming the conductive material co-planar with a first contact to the first segment of the first gate structure and co-planar with a second contact element that extends to a source/drain region disposed in the semiconductor substrate adjacent the first segment of the first gate structure.

5. The method of claim 4, further comprising:
   forming spacer elements on the sidewalls of the second segment of the first gate structure and the third segment of the second gate structure, and wherein the forming the interconnect structure includes forming the planar bottom surface of the conductive material on a top surface of the spacer elements of each of the second segment and the third segment.

6. The method of claim 1, further comprising:
   forming a contact plug coupled to the first gate structure concurrently with forming the interconnect structure such that the contact plug is co-planar with the planar bottom surface of the conductive material.

7. The method of claim 1, further comprising:
   forming a masking element over the first gate structure and the second gate structure, wherein the masking element exposes a region for the cutting the first gate structure and the second gate structure, while protecting another region of each of the first gate structure and the second gate structure.

8. The method of claim 1, wherein the performing the inclined cut of the first gate structure and the second gate structure forms the first segment having an end surface that is non-orthogonal with respect to a centerline extending a length of the first segment.

9. The method of claim 1, further comprising:
   wherein the cutting the first gate structure and the second gate structure includes cutting the first and second gate structures comprising polysilicon and a gate dielectric underlying the polysilicon.

10. The method of claim 9, further comprising:
    after the cutting, replacing the polysilicon of the first and second segments with a plurality of metal layers.

11. A method of fabricating a semiconductor device, comprising:
    over a substrate, forming a first gate structure and a second gate structure adjacent and parallel with the first gate structure;
    concurrently etching the first gate structure to form a first gate structure segment and a second gate structure segment while etching the second gate structure to form a third gate structure segment and a fourth gate structure segment,
    wherein the etching includes a non-orthogonal cut of the first gate structure and the second gate structure such that the first gate structure segment has an end with a face defined by linear edges, wherein a plane extending from the face is non-orthogonal to a sidewall of the first gate structure;

forming an interconnect structure having a bottom surface that is planar and extends to directly interface each of the second gate structure segment and the third gate structure segment;

forming a single via extending to a source/drain region of the substrate adjacent the first gate structure segment; and filling the single via with tungsten to from a contact element co-planar with the interconnect structure.

12. The method of claim 11, wherein the non-orthogonal cut is approximately 45 degrees with respect to the sidewall of first gate structure.

13. The method of claim 11, further comprising:
wherein the non-orthogonal cut is disposed over a shallow trench isolation structure of the substrate.

14. The method of claim 11, wherein the forming the contact element to the source/drain region includes forming the contact element with contiguous linear sidewalls extending from a top surface of the contact element to an interface with the source/drain region.

15. The method of claim 14, further comprising: concurrently with forming the interconnect structure, forming another contact element interfacing the first gate structure segment such that the another contact element and the interconnect structure have co-planar bottom surfaces.

16. A method of semiconductor fabrication, comprising:
forming a plurality of gate structures over a semiconductor substrate;
providing a masking element over the plurality of gate structures;
etching the plurality of gate structures while the masking element is disposed over the plurality of gate structures, wherein the etching performs a non-orthogonal cut of the plurality of gate structures to provide a first segment and a second segment of each of the plurality of gate structures; and
after the etching, concurrently forming a contact structure to the first segment of a first gate structure of the plurality of gate structures while forming a contact-level interconnection between the second segment of the first gate structure and the first segment of a second gate structure of the plurality of gate structures wherein forming the contact-level interconnection includes forming a conductive material having a rectangular-shape including a planar bottom surface, a first end surface and a second end surface opposing the first end surface, wherein the planar bottom surface extends from an interface with the second segment of the first gate structure including the first end surface to an interface with the first segment of the second gate structure including the second end surface.

17. The method of claim 16, wherein the non-orthogonal cut concurrently provides a surface of a respective face of each of the first segment and second segment that is inclined compared to a sidewall of the first segment or the second segment wherein the surface of the respective face of the second segment of the first gate structure interfaces the planar bottom surface of the conductive material and wherein the surface of the respective face of the first segment of the first gate structure interfaces the planar bottom surface of the conductive material.

18. The method of claim 16, further comprising:
after the etching and prior to the forming the contact structure, performing a gate replacement process.

19. The method of claim 16, wherein the non-orthogonal cut extends across the plurality of gate structures at an angle of less than 90 degrees with respect to a centerline drawn along a length of each of the plurality of gate structures, wherein the length of each of the plurality of gate structures is greater than a width of each of the plurality of gate structures.

20. The method of claim 16, further comprising: after the etching, forming spacer elements on the sidewalls of each of the first segment and second segments of the plurality of gate structures; and
wherein the planar bottom surface of the conductive material is formed interfacing the spacer elements of the second segment of the first gate structure and the spacer elements of the first segment of the second gate structure.

* * * * *